US012679598B2

(12) United States Patent
Nandwana et al.

(10) Patent No.: US 12,679,598 B2
(45) Date of Patent: Jul. 14, 2026

(54) METHOD, ASSEMBLY AND KIT FOR TRANSPORTING A GAS DISTRIBUTION DEVICE

(71) Applicant: ASM IP Holding B.V., Almere (NL)

(72) Inventors: Dinkar Nandwana, Chandler, AZ (US); Mohamed Imthiyas Thangaiah, Tokyo (JP); Nathan Hanrahan, Rio Rancho, NM (US); Haibin Liang, Maricopa, AZ (US); Ryan Piazzo, Queen Creek, AZ (US)

(73) Assignee: ASM IP Holding B.V., Almere (NL)

( * ) Notice: Subject to any disclaimer, the term of this patent is extended or adjusted under 35 U.S.C. 154(b) by 246 days.

(21) Appl. No.: 18/670,922

(22) Filed: May 22, 2024

(65) Prior Publication Data

US 2024/0391645 A1     Nov. 28, 2024

Related U.S. Application Data

(60) Provisional application No. 63/468,870, filed on May 25, 2023.

(51) Int. Cl.
| | |
|---|---|
| *B65D 25/10* | (2006.01) |
| *B65D 25/28* | (2006.01) |
| *B65D 85/68* | (2006.01) |
| *C23C 16/455* | (2006.01) |

(52) U.S. Cl.
CPC ........... *B65D 25/10* (2013.01); *B65D 25/282* (2013.01); *B65D 85/68* (2013.01); *C23C 16/45565* (2013.01)

(58) Field of Classification Search
CPC ...... B65D 25/10; B65D 25/282; B65D 85/68; C23C 16/45565
See application file for complete search history.

(56) References Cited

U.S. PATENT DOCUMENTS

| | | |
|---|---|---|
| D931,978 S | 9/2021 | Giang |
| 2024/0093367 A1* | 3/2024 | Dharmapura Sathyanarayanamurthy ............... C23C 16/4412 |

* cited by examiner

*Primary Examiner* — P. Macade Nichols
(74) *Attorney, Agent, or Firm* — Snell & Wilmer L.L.P.

(57) ABSTRACT

Methods, kits, and assemblies suitable for gas distribution device transportation are disclosed. An exemplary assembly includes a gas distribution device transport assembly comprising a housing comprising a recess to receive a gas distribution device, a clamping plate to secure the gas distribution device to the housing, a valve assembly, and at least one data logger assembly. Also disclosed is a gas distribution device transport kit comprising a kit housing and the gas distribution device transport assembly. An exemplary method includes transporting the gas distribution device transport kit.

20 Claims, 7 Drawing Sheets

METHOD, ASSEMBLY AND KIT FOR TRANSPORTING A GAS DISTRIBUTION DEVICE

CROSS-REFERENCE TO RELATED APPLICATIONS

This application claims priority to and the benefits of U.S. Provisional Patent Application No. 63/468,870, filed May 25, 2023, the contents of which are incorporated herein by reference in their entirety.

FIELD OF INVENTION

The present disclosure generally relates to methods and systems for protection and transportation of gas distribution devices. More particularly, the disclosure relates to methods and systems suitable for monitoring gas distribution devices conditions during transport.

BACKGROUND OF THE DISCLOSURE

Gas-phase reactors, such as chemical vapor deposition (CVD) reactors and the like, can be used for a variety of applications, including depositing materials to form films on substrates. For example, gas-phase reactors can be used to deposit metal layers on a substrate to form devices, such as semiconductor devices, flat panel display devices, photovoltaic devices, microelectromechanical systems (MEMS), and the like.

A typical reactor system includes a reactor including a gas distribution device, a reaction chamber, and one or more precursor and/or reactant gas sources fluidly coupled to the reaction chamber. Such reactor systems are typically located, at least partially within a clean room.

During operation of such reactor systems, contamination can form or deposit on the gas distribution device. If left untreated, such contamination can result in contamination or other defects in films deposited using the reactor system.

Accordingly, the gas distribution device may periodically be removed and transported to be cleaned. In such cases the gas distribution devices are dissembled, cleaned, and then transported back to the site of the reactor system, or taken apart, cleaned, reassembled, depressurized to a vacuum state, and transported back to the site.

While transporting the gas distribution device, such as a showerhead device or the like, to/from a clean environment (e.g., a clean room), it is often desirable to maintain a vacuum pressure within at least a portion of the gas distribution device. While some techniques have been developed to transport cleaned and vacuum pressured gas distribution devices, such methods may suffer various drawbacks. With typical methods and systems, pressure leaks and overheating at least within a portion of the gas distribution device may go undiscovered until the gas distribution device is physically inspected. If a problem occurs, it may be difficult to determine where and when such problem arose, which may make it difficult to determine a party at fault for the problem. Accordingly, improved methods, assemblies, and kits are desired to help determine where and when a leak, overheating, or the like occurs during transportation of a vacuum pressured gas distribution device.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to improved methods, assemblies, and kits suitable for monitoring various parameters of a (e.g., a cleaned and vacuum pressure) gas distribution device while in transit. While the ways in which various embodiments of the present disclosure address drawbacks of prior systems and methods are discussed in more detail below, in general, various embodiments of the disclosure provide methods, assemblies, and kits that can be used to, for example, monitor the pressure, temperature, acceleration of the gas distribution device, and/or humidity within the gas distribution device portions thereof, or housing coupled to the gas distribution device throughout transit. For example, exemplary methods can be used to monitor and transmit pressure, temperature, acceleration data and/or humidity data to a user device or to a display. Examples of the disclosure can provide improved tracking of when and where pressure leaks or other events occurred in transit, which can help resolve issues of, for example, which party is liable for any damage to the gas distribution device.

In accordance with additional embodiments of the disclosure, a gas distribution device transport assembly is provided. The gas distribution device transport assembly includes a gas distribution device transport comprising a housing having a top surface comprising a recess therein, a clamping plate configured to secure a gas distribution device to the housing, a valve assembly coupled to the gas distribution device, and a first data logger assembly coupled to one or more of the valve assembly or the housing. In accordance with examples of additional embodiments, a lower surface of the gas distribution device and a portion of the recess define a volume. The volume can be in fluid communication with the valve assembly. In accordance with additional embodiments of the disclosure, the first data logger assembly comprises a first memory device and a first measurement device. In accordance with further exemplary embodiments, the first measurement device can comprise at least one of a first pressure sensor, a first temperature sensor, a first accelerometer and/or a first humidity sensor. The first memory device is configured to record data received from the first measurement device.

In accordance with additional embodiments of the disclosure, the gas distribution device comprises a showerhead. In accordance with further exemplary embodiments, a second data logger assembly can be coupled to one or more of the housing or the valve assembly. The second data logger assembly comprises a second memory device and a second measurement device. In accordance with further exemplary embodiments, the second measurement device can comprise at least one of a second pressure sensor, a second temperature sensor, a second accelerometer, and/or a second humidity sensor. The second memory device records data received from the second measurement device. In various embodiments, the gas distribution device transport assembly can comprise the first data logger assembly and the second data logger assembly, or just the first data logger assembly. The first data logger assembly and/or the second data logger assembly can comprise a measurement display. The measurement display may be a digital screen, an analog gauge, or the like. In yet further embodiments, the first data logger assembly and/or the second data logger assembly is configured to wirelessly transmit the recorded data to a user device, a display and/or the measurement display.

In accordance with additional embodiments of the disclosure, a gas distribution device transport kit is provided. An exemplary assembly includes a kit housing, wherein the kit housing comprises a housing wall comprising a wall top surface, a main compartment configured to receive a gas distribution device transport assembly, such as the gas distribution device transport assembly as described above or elsewhere herein, and a top configured to engage the kit housing to enclose the gas distribution device assembly. In accordance with additional embodiments of the disclosure, the kit housing can comprise a second compartment and a third compartment, each adjacent to the main compartment and on opposite sides of the main compartment. The second compartment and third compartment can be used to house additional parts for the reactor system in transit. In accordance with additional embodiments of the disclosure, the top can comprise a display in wireless communication with the first data logger assembly and/or the second data logger assembly. The display can be configured as a graphical user interface (GUI), for example to display (e.g., present) information corresponding to the data recorded by the first data logger assembly and/or the second data logger assembly.

In accordance with additional embodiments of the disclosure, a method is provided. An exemplary method includes coupling a gas distribution device to a housing to form a gas distribution device transport assembly, such as the gas distribution device transport assembly described above or elsewhere herein. In accordance with examples of embodiments, the method can further comprise coupling a valve assembly to the gas distribution device, wherein the valve assembly and the volume are in fluid communication; reducing a pressure within a volume defined by a portion of the housing and a lower surface of the gas distribution device to a vacuum pressure; positioning the gas distribution device transport assembly within a main compartment of a gas distribution device transport kit; securing a top to the main compartment to enclose the gas distribution device transport assembly; logging data using a first data logger assembly, wherein the data corresponds to one or more of: the pressure within the volume, a temperature of the gas distribution device, an acceleration of the gas distribution device, and/or humidity within the gas distribution device; and transporting the gas distribution device transport kit to a destination.

In accordance with further examples of embodiments, the method can further comprise removing the gas distribution device transport assembly and installing the gas distribution device in a reaction chamber. In accordance with further examples of embodiments, the method can further comprise performing a gas leak test of the gas distribution device transport assembly. In accordance with further examples of embodiments, the method can further comprise comparing, by at least one of the first data logger assembly or the second data logger assembly, the data to a threshold value that is programmed and saved to a memory device in the data logger assembly.

If the recorded data is above or below the threshold value, then an alert notification can be transmitted by at least one of the first data logger assembly and the second data logger assembly to one or more of a user device, a display, and a measurement display.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
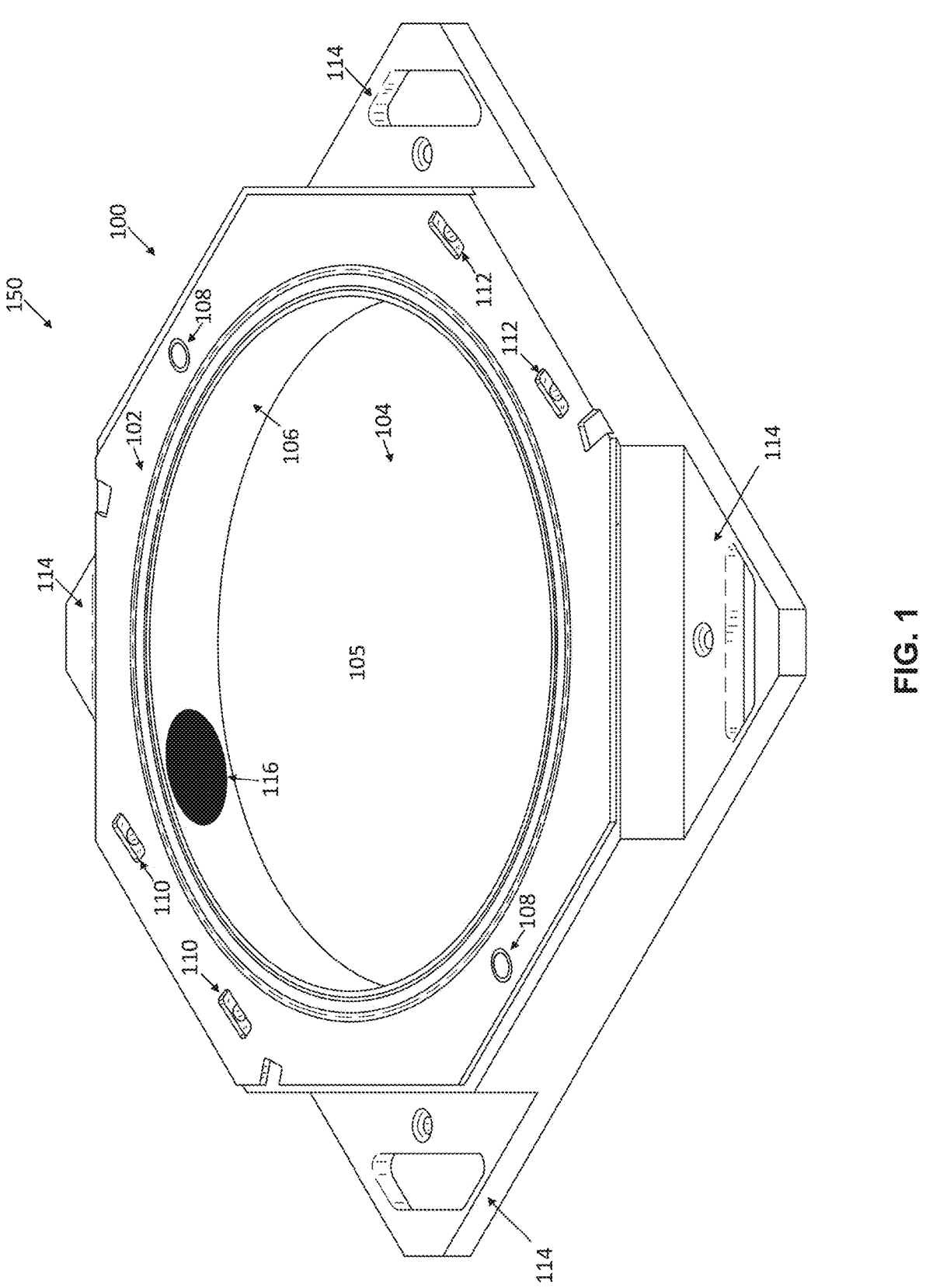
FIG. 1 illustrates an isometric view of a housing of a gas distribution device transport assembly in accordance with exemplary embodiments of the disclosure.

It will be appreciated that elements in the figures are illustrated for simplicity and clarity and have not necessarily been drawn to scale. For example, the dimensions of some of the elements in the figures can be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, "communication" means communication of electronic signals with physical coupling (e.g., "electrical communication" or "electrically coupled") or without physical coupling and via an electromagnetic field (e.g., "radio frequency communication" or "radio frequency coupled" or "radio frequency coupling"). As used herein, "transmit" may include sending electronic data from one system component to another via electronic communication between the components. Additionally, as used herein, "data" may include encompassing information such as commands, queries, files, data for storage, and the like in digital or any other form which can be transmitted via electronic communication.

First and/or second memories can include a database. Any databases, systems, devices, servers, or other components of the system may consist of any combination thereof at a single location or at multiple locations, wherein each database or system includes any of various suitable security features, such as firewalls, access codes, encryption, decryption, public and private keys, and/or the like.

As used herein, the term "network" includes any cloud, cloud computing system, or electronic communications system or method which incorporates hardware and/or software components. Communication among the parties may be accomplished through any suitable communication channels, such as, for example, a telephone network, an extranet, an intranet, internet, personal internet device, online communications, satellite communications, off-line communications, wireless communications, transponder communications, local area network (LAN), wide area network (WAN), virtual private network (VPN), networked or linked devices, keyboard, mouse, and/or any suitable communication or data input modality. Specific information related to the protocols, standards, and application software utilized in connection with the internet is generally known to those skilled in the art and, as such, need not be detailed herein.

As used herein, the terms "data logger" and/or "data logger assembly" can refer to a device comprising one or more measurement devices (i.e., a pressure sensor, a temperature sensor, or an accelerometer, and/or a humidity sensor), a memory device to record data from one or more measurement devices, a power source (i.e., a battery) and a transmitter to transmit the data electronically over a network to a user device or a display. Any suitable computer-readable storage medium may be utilized for the first and/or second memory, including optical storage devices, magnetic storage devices, flash disk, flash memory, RAM, ROM, and/or the like.

As used herein, the term "gas distribution device" can refer to a showerhead, a gas channel and/or the like, configured to introduce precursors (and/or reactants) into a reaction chamber to deposit or form a layer over a substrate. Gas distribution devices described herein can be used in connection with chemical vapor deposition (CVD), atomic layer deposition (ALD), plasma enhanced chemical vapor deposition (PECVD), plasma enhanced atomic layer deposition (PEALD), CVD/ALD hybrid deposition, etch and/or cleaning processes.

In this disclosure, any two numbers of a variable can constitute a workable range of the variable, and any ranges indicated can include or exclude the endpoints. Additionally, any values of variables indicated (regardless of whether they are indicated with "about" or not) can refer to precise values or approximate values and include equivalents, and can refer to average, median, representative, majority, etc. in some embodiments. Further, in this disclosure, the terms "comprising," "including," "constituted by" and "having" can refer independently to "typically or broadly comprising," "consisting essentially of," or "consisting of" in some embodiments. In this disclosure, any defined meanings do not necessarily exclude ordinary and customary meanings in some embodiments.

The present disclosure generally relates to methods, assemblies, and kits suitable for use with transporting gas distribution devices. By way of examples, the methods, assemblies, and kits can be used to monitor, record, and transmit data, such as pressure, temperature, acceleration data, and/or humidity data associated with the gas distribution device while in transit to a destination.

Turning now to the figures, FIG. 1 illustrates an exemplary housing 100 and an assembly 150 according to embodiments of the present disclosure. The housing 100 comprises a top surface 102 comprising a recess 104 formed therein. In the illustrated example, the recess 104 is defined by a recess wall 106 and a recess bottom surface 105. The recess 104 is configured to receive a gas distribution device, such as a gas distribution device described in more detail below. The top surface 102 also comprises one or more (e.g., a pair) anchor holes 108. Each anchor hole 108 is configured to receive an anchor. Top surface 102 also comprises a first set of clamping plate connector holes 110 configured to receive a first clamping plate and a second set of clamping plate connector holes 112 configured to receive a second clamping plate. The housing 100 also comprises at least one housing connector 114 configured to secure the housing 100 in a transport kit for transporting the housing 100.

Assembly 150 includes the housing 100 and can comprise a data logger assembly 116 disposed in the recess wall 106 of the housing 100 or elsewhere on the housing 100. The data logger assembly 116 comprises one or more measurement devices, exemplary measurement devices include a pressure sensor, a temperature sensor, and/or an accelerometer. In various embodiments, the data logger assembly 116 also comprises a wireless transmitter to transmit (e.g., recorded) data from the one or more measurement devices to, for example, a user device. The data can be transmitted over a network.

In certain examples of the present disclosure the data logger assembly 116 may be in communication with the environment external to the housing 100. In this this respect it is contemplated the data logger assembly 116 may include one or more of a temperature sensor, a humidity sensor, and accelerometer each disposed in communication with a data logger. In such examples the data logger may include a memory, the pressure sensor may in communication with the recess 105 defined within the housing 100 and the memory to report pressure within the housing 100, the temperature sensor and the humidity in communication with the external environment outside of the 100 and the memory to report temperature and humidity of the external environment outside of the housing 100, and the accelerometer may be mechanically fixed to the housing and in communication with the memory to report accelerations (e.g., impacts) to the housing. As will be appreciated by those of skill in the art in view of the present disclosure, recording temperature and humidity as well as acceleration enables drill down to root cause in the event that pressure changes within the housing 100 during shipment. In accordance with certain examples of the disclosure, the data logger assembly 116 may be a distributed data logger assembly including a pressure data logger configured to log pressure within the housing 100 remote from a transportation data logger configured to log one or more of acceleration (e.g., impacts) of the housing as well as temperature and humidity in the environment external to the housing 100. For example, the pressure data logger may be threadedly seated in the housing 100 and the transportation data logger may be clamped to an exterior of the housing 100 or be within the housing 100. Examples of suitable pressure data loggers include OM series pressure data loggers include OM series pressure data loggers, available from Omega Engineering of Norwalk, Connecticut; examples of suitable temperature, pressure, and acceleration data loggers include MSR series transportation data loggers, available from MicroDAQ, LLC of Concord, New Hampshire.

Figure 2:
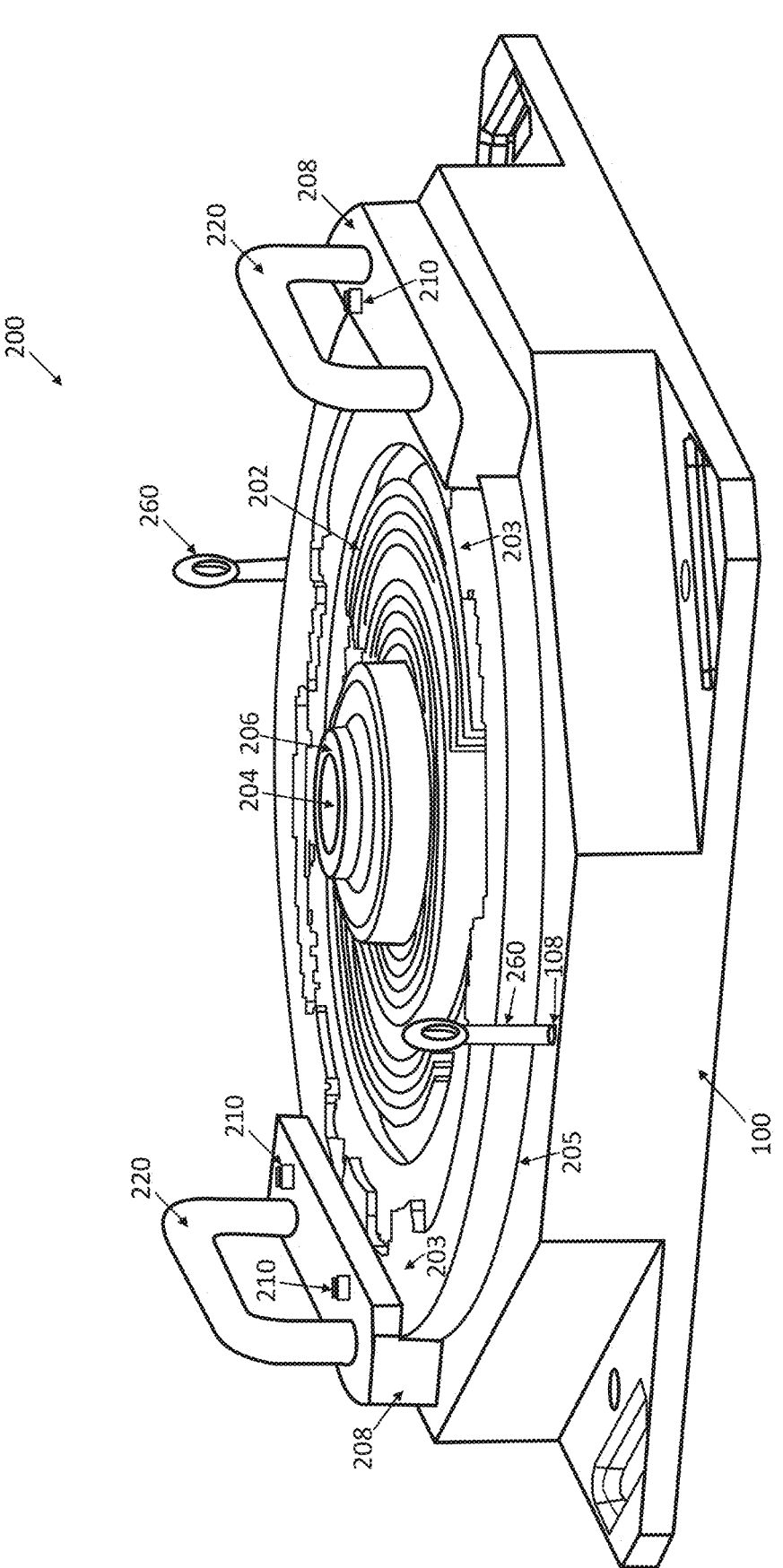
FIG. 2 illustrates an isometric view of a gas distribution device transport assembly in accordance with exemplary embodiments of the disclosure.

FIG. 2 illustrates a gas distribution device transport assembly 200 in accordance with additional embodiments of the disclosure. Gas distribution device transport assembly 200 includes the housing 100, and a gas distribution device 202. The gas distribution device 202 optionally is coupled to the housing 100. A bottom surface 205 of the gas distribution device 202 and a portion of the recess (defined by the recess bottom surface 105 and the recess wall 106) define a volume (not illustrated). A gas distribution device connector 206 defines a gas distribution device inlet 204 in fluid communication with the volume. The gas distribution device 202 is positioned on the top surface 102 of the housing 100 and the gas distribution device 202 is coupled to the housing 100 with one or more clamping plates 208. The clamping plates 208 are configured to couple to the housing 100 using the first set of clamping plate connector holes 110 and the second set of clamping plate connector holes 112. In various embodiments, the clamping plates 208 are further secured to a top surface 203 of the gas distribution device 202 by the fasteners 210, that are at least partially disposed within the first set of clamping plate connector holes 110 and the second set of clamping plate connector holes 112. Exemplary fasteners include, for example, bolts, screws, and the like. In various embodiments, handles 220 are coupled to the clamping plates 208. The handles 220 can be coupled using fasteners as described herein. Alternatively, clamping plate 208 and handle 220 can form an integral piece. In various embodiments, anchors 260 are coupled to the housing at anchor holes 108. The anchors 260 comprise a (e.g., threaded) shaft and a head with a (e.g., circular) hole therein.

Figure 3:
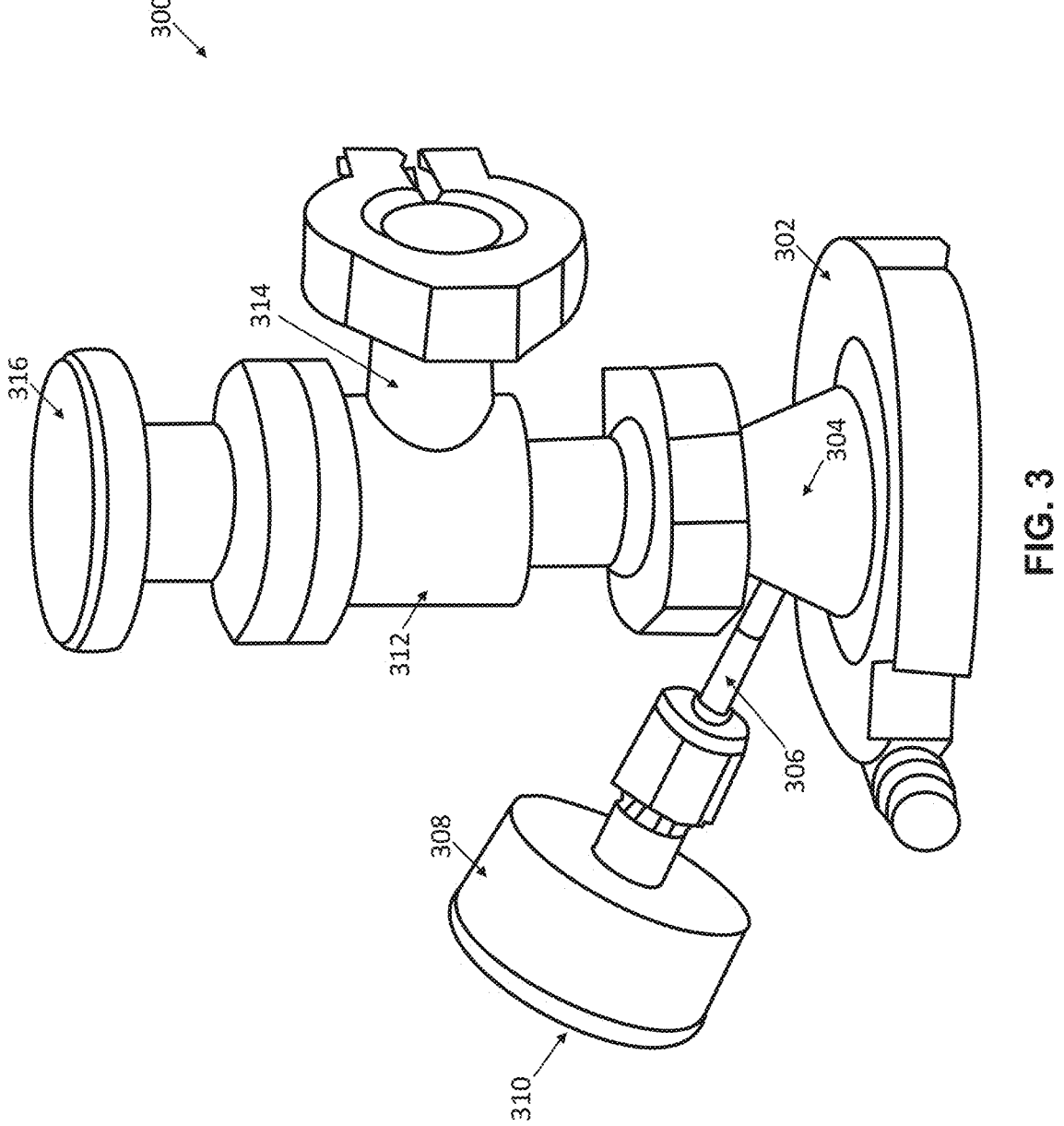
FIG. 3 illustrates an isometric view of a valve assembly in accordance with exemplary embodiments of the disclosure.
Figure 4:
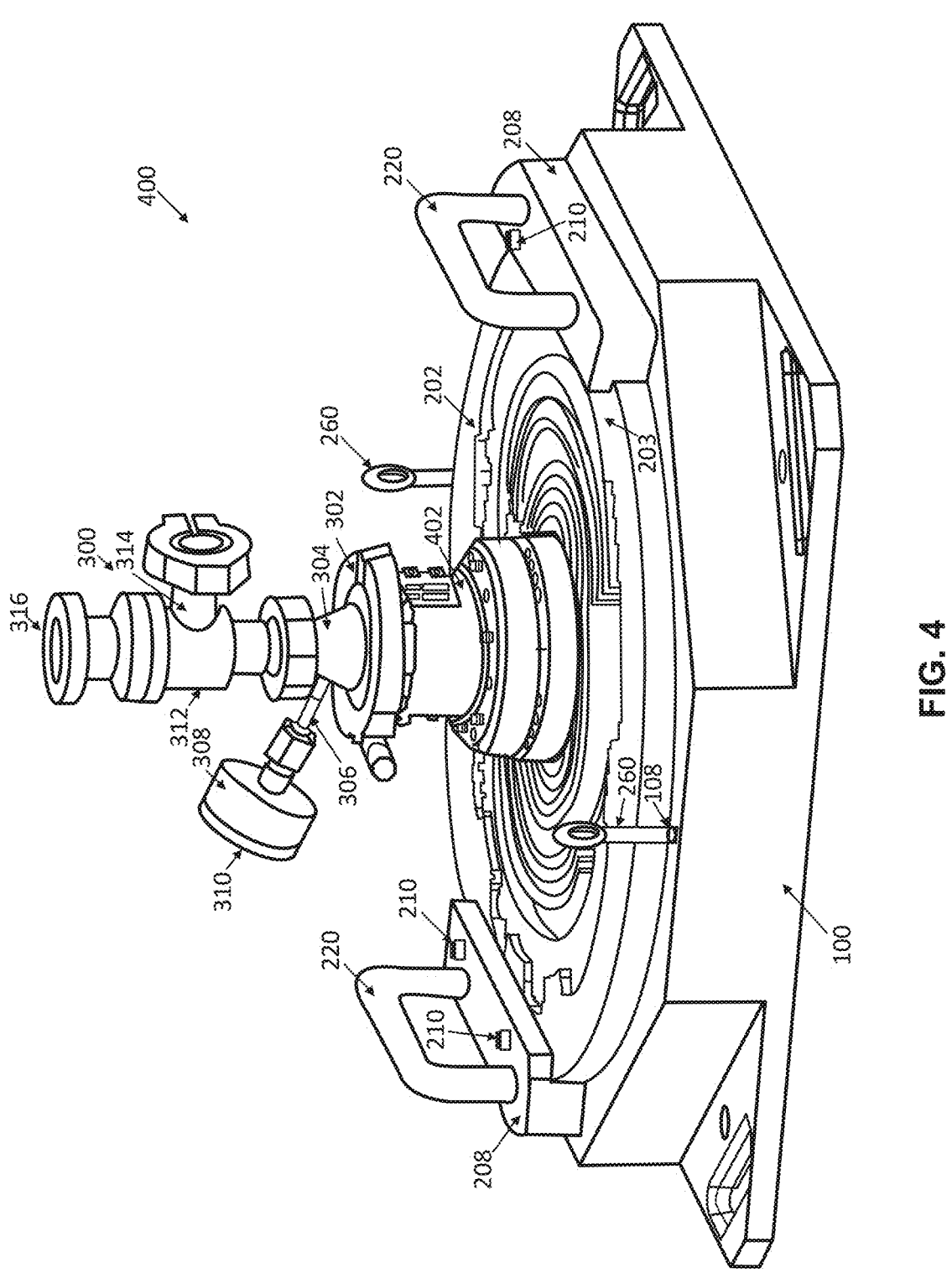
FIG. 4 illustrates an isometric view of a gas distribution device transport assembly in accordance with exemplary embodiments of the disclosure.

FIG. 3 illustrates an exemplary valve assembly 300 according to embodiments of the present disclosure. The valve assembly 300 comprises a locking clamp 302 configured to couple and seal the valve assembly 300 to a manifold, a reducer 304 and a cantilevered arm 306 extending from the device. In other embodiments, reducer 304 can be replaces with a cylindrical tube.

The cantilevered arm 306 can extend from the reducer 304 at an angle between about 50 degrees to about 70 degrees. A length of the cantilevered arm 306 can be between about 2 centimeters and about 3.5 centimeters or between about 2.5 centimeters and about 3 centimeters. An outer diameter of the cantilevered arm 306 can be between about 5 millimeters and about 6.5 millimeters. The dimensions of the cantilevered arm 306 and the angle of the cantilevered arm 306 have the effect of preventing the expected shock and impulse forces exerted on the data logger assembly 116 during ground and air shipment from causing a breach of the vacuum environment within the assembly.

In various embodiments, the cantilevered arm 306 supports a data logger assembly 308 in fluid communication with the reducer 304. In the illustrated embodiment, the data logger assembly 308 comprises a display 310 which (e.g., visually) presents the data of the data logger assembly 308. The display 310 can be an analog or a digital display and can be wired or wirelessly connected to a least one of the data logger assemblies 116 and 308. In certain embodiments, the data logger assembly 308 may include a data port, such as USB cable interface. In such examples the datalogger assembly 208 may not have a user display.

In the illustrated example, the valve assembly 300 further comprises a valve bellows 312 coupled to and in fluid communication with the reducer 304. The valve bellows 312 comprises a flange 314 and a valve bellows top 316.

With combined reference to FIGS. 1-4, FIG. 4 illustrates an exemplary gas distribution device transport assembly 400. In accordance with further examples of the disclosure, gas distribution device transport assembly 400 includes the housing 100, the gas distribution device 202 coupled to the housing 100 and the valve assembly 300. The gas distribution device transport assembly 400 further includes a manifold 402 coupled and sealed to the gas distribution device 202 at the gas distribution device connector 206. The manifold 402 is in fluid communication with the volume. In the illustrated embodiment, the valve assembly 300 is coupled and sealed to the manifold 402 by the locking clamp 302. In various embodiments, the data logger assembly 308 is in fluid communication with the volume and the data logger assembly 308 can measure at least one of a pressure within the volume, a temperature of the gas distribution device, or an acceleration of the gas distribution device 202.

In various embodiments, the data logger assemblies 116 and 308 can measure and record data (i.e., pressure data, temperature data, and/or acceleration data) continuously over a recording period. During the recording period, the recorded data can be logged and compared to a threshold value by the data logger assemblies 116 and 308. In various embodiments, if the recorded data exceeds (or falls below) the threshold value, then the data logger assembly transmits an alert notification to a user device or a display (such as display 310). In certain examples, such as in examples where the data logger is distributed, one of the data loggers may trigger another of the data loggers. For example, an accelerometer packaged in one data logger assembly may trigger a pressure sensor packaged in another data logger. As will be appreciated by those of skill in the art in view of the present disclosure, this can simplify logging, for example by eliminating the need to synchronize clocks included the distributed data loggers.

Figure 5:
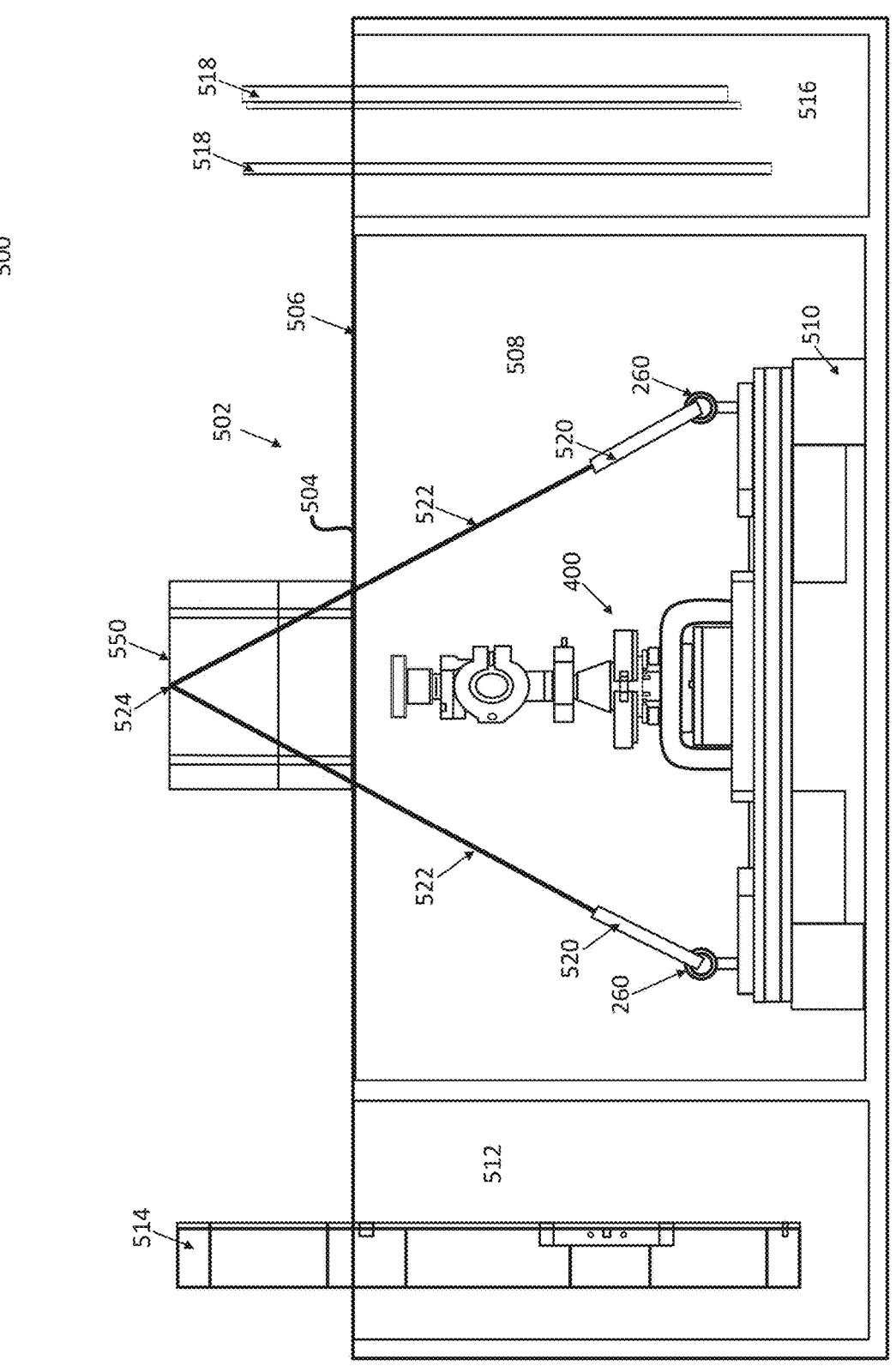
FIG. 5 illustrates a cross sectional view of a gas distribution device transport kit in accordance with exemplary embodiments of the disclosure.

With reference to FIG. 5, a gas distribution device transport kit 500 is illustrated. In various embodiments, the gas distribution device transport kit 500 comprises a kit housing 502. The kit housing 502 comprises a housing wall 504 and a wall top surface 506. In various embodiments, the kit housing 502 includes a main compartment 508 configured to receive a gas distribution device transport assembly, such as gas distribution device transport assembly 400. The main compartment 508 houses a base 510 configured to connect with the one or more housing connectors 114 of the gas distribution device transport assembly 400 to hold and retain the gas distribution device transport assembly 400 in place.

In various embodiments, the kit housing 502 comprises a second compartment 512. The second compartment 512 is adjacent to the main compartment 508. In various embodiments, the second compartment 512 is configured to hold an exhaust duct 514. The exhaust duct 514 is configured to connect to the gas distribution device 202 once the gas distribution device 202 reaches its destination. In various embodiments, the second compartment 512 can hold other parts of a reactor to be transported. The second compartment 512 can comprise a packing material to prevent the exhaust duct 514, or any other part shipped in the second compartment 512, from moving in transit. The packing material can comprise polyethylene foam such as extruded polyethylene, cross-linked polyethylene, and extruded polyethylene, and polyolefin, or any other type of cleanroom compatible packaging material.

In various embodiments, the kit housing 502 comprises a third compartment 516. The third compartment 516 is adjacent to the main compartment 508, opposite the second compartment 512. In various embodiments, the third compartment 516 is configured to hold one or more flow control rings 518. The one or more flow control rings 518 are configured to connect to the gas distribution device 202 once the gas distribution device 202 reaches a destination. In various embodiments, the third compartment 516 can hold other parts of a reactor to be transported to the customer. The third compartment 516 can comprise the packing material to mitigate the one or more flow control rings 518, or any other part shipped in the third compartment 516, from moving relative to kit housing 502 in transit.

In the illustrated example, the gas distribution device transport assembly 400 is placed in the main compartment 508 of the kit housing 502. In various embodiments, each anchor 260 is coupled to a cable 522 (e.g., using a carabiner or other coupling means). The cable 522 may comprise braided wire, such as braided stainless-steel wire or any other type of corrosion-resistant braided wire. In various embodiments, the cables 522 are connected to a jig 550 which is configured to raise and lower the gas distribution device transport assembly 400 into and/or out of the kit housing 502.

Figure 6:
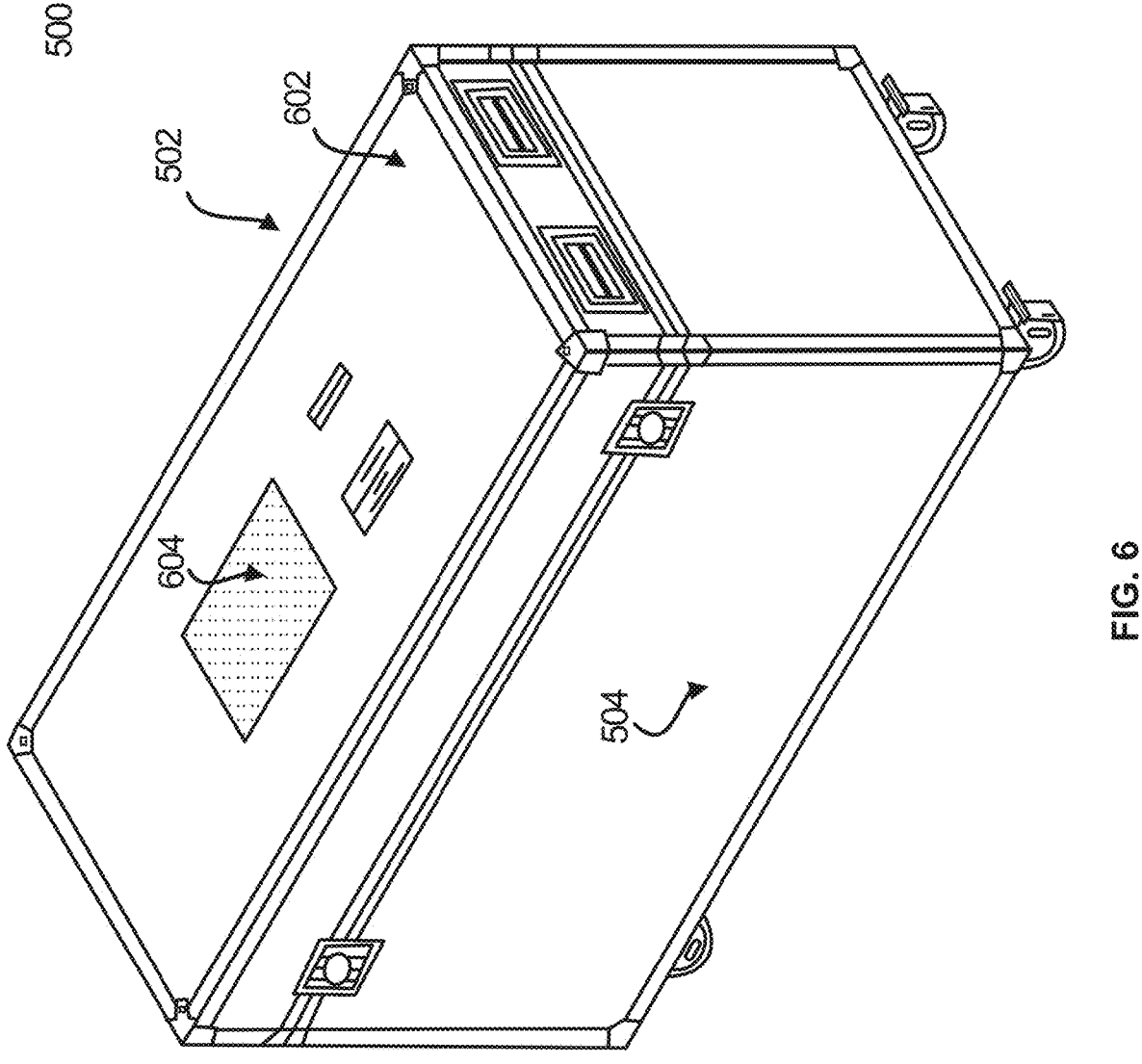
FIG. 6 illustrates an isometric view of a gas distribution device transport kit in accordance with exemplary embodiments of the disclosure.

With reference to FIG. 6, the gas distribution device transport kit 500 is illustrated ready for transport. In various embodiments, the kit housing 502 further comprises a top 602 configured to couple with the wall top surface 506 of the housing wall 504 and enclose the main compartment 508. In various embodiments, the top 602 also encloses the second compartment 512 and the third compartment 516. The top 602 can comprise a display 604. The display 604 can comprise a GUI for users to interact with. Further, the display 604 can be in electronic communication with one or more of the data logger assemblies 116 and 308. If the recorded data exceeds and/or falls below a threshold value, then the data logger assemblies 116 and 308 can transmit the alert notification to the display 604 and/or to a user device. The alert notification can comprise a time when the data exceeded or fell below the threshold value, which data exceeded or fell below the threshold value (i.e., a pressure threshold value, a temperature threshold value, and/or an acceleration threshold value) and/or a location in which data exceeded or fell below the threshold value.

Figure 7:
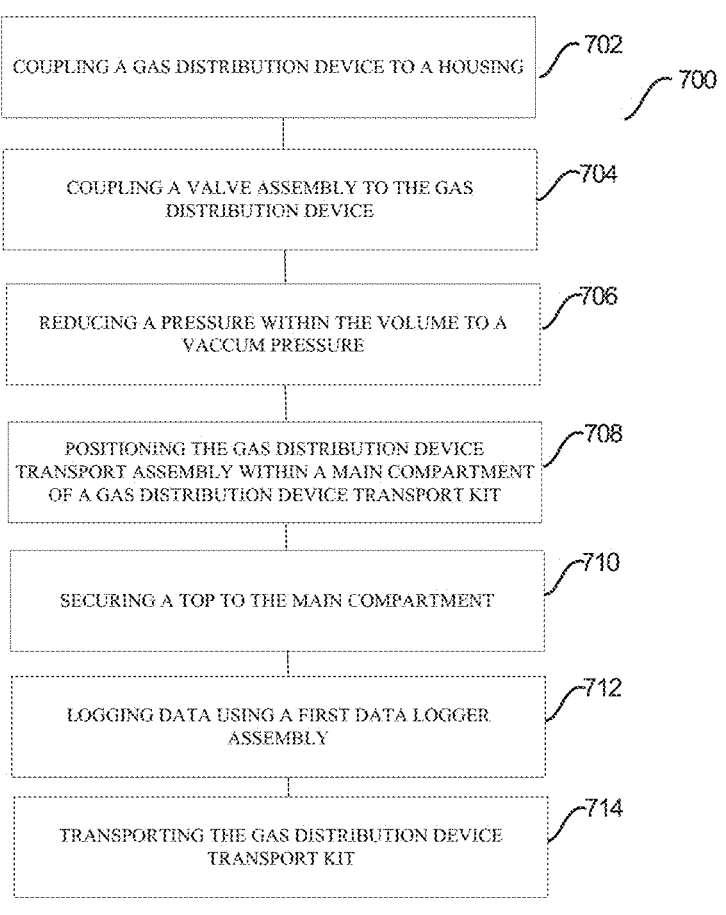
FIG. 7 illustrates a method in accordance with exemplary embodiments of the disclosure.

With reference to FIG. 7, a method 700 according to embodiments of the disclosure is illustrated. Method 700 includes a step 702 of coupling a gas distribution device (such as gas distribution device 202) to a housing (such as housing 100) to form a gas distribution device transport assembly (such as gas distribution device transport assembly 400). The housing can comprise a top surface (such as a top surface 102) comprising a recess (such as recess 104) configured to removably and sealably receive a bottom portion of the gas distribution device. A volume is defined by a portion of the recess (such as the portion of the recess defined by the recess bottom surface 105 and the recess wall 106) and the bottom portion of the gas distribution device. In various embodiments, a first data logger assembly (such as data logger assembly 116) is coupled to the housing.

Method 700 can include a step 704, which involves coupling a valve assembly (such as valve assembly 300) to the gas distribution device, wherein the valve assembly and the volume are in fluid communication. In various embodiments, the valve assembly comprises a second data logger assembly (such as data logger assembly 308) which is also in fluid communication with the volume such that a pressure in the volume can be measured by the data logger assembly.

Method 700 can include a step 706, which involves reducing the pressure within the volume to a vacuum pressure. The resulting pressure in the volume can be between about 0 torr and about 760 torr or between about 0 torr and about 300 torr. It may be desirable during method 700 to maintain the pressure within the volume within those described vacuum ranges. It may be desirable to reduce the vacuum pressure within the volume to about 300 torr, which insures quality of the gas distribution device and helps prevent contamination to the gas distribution device through transit. Further, reducing the pressure within the volume to less than 300 torr can make it easier to determine whether a leak has occurred during transportation of the gas distribution device.

Method 700 can include a step 708, which involves positioning the gas distribution device transport assembly within a main compartment of a gas distribution device transport kit (such as gas distribution device transport kit 500). Further, method 700 can include a step 710, which involves securing a top (such as top 602) to the main compartment of the gas distribution device transport kit.

Method 700 can include a step 712, which involves logging data using the first data logger assembly and/or the second data logger assembly to record and store data one or more measurement devices as described herein, wherein the data corresponds to one or more of: the pressure within the volume, a temperature of the gas distribution device, or an acceleration of the gas distribution device.

In exemplary embodiments, a threshold value may be saved in the first data logger assembly and/or the second data logger assembly for one or more of a pressure data, a temperature data and an acceleration data. The threshold value can comprise the pressure data which can be between about 0 torr and 760 torr or between about 0 torr and about 300 torr. In exemplary embodiments, the threshold value for the temperature data can be between about −20° C. and 100° C. or between about 0° C. and about 75° C. In exemplary embodiments, the threshold value for the acceleration data can be between about −34 m/s² and 34 m/s² or between about −25.5 m/s² and about 25.5 m/s². The acceleration range for the threshold value was determined by looking at data collected for cargo during air transportation. The recited acceleration range captures normal acceleration data during transit, while acceleration less than or more than the acceleration range would indicate an abnormal event during transport.

In various embodiments, the first data logger assembly and/or the second data logger assembly compare the data recorded from the one or more measurement devices to the threshold value. In various embodiments, the first data logger assembly and/or the second data logger assembly compares the data recorded by the one or more measurement devices to the threshold value. In various embodiments, if the data recorded by the one or more measurement devices exceeds or falls below the threshold value, then the first data logger assembly or the second data logger assembly transmits an alert notification to a display (such as display 310), a remote device and/or a user device. The alert notification can be transmitted wirelessly, and it can command the display, the remote device or the user device to present information corresponding to the data recorded by the first data logger assembly and/or the second data logger assembly to a GUI.

Method 700 can include a step 714, which involves transporting the gas distribution device transport kit to the destination. For example, the gas distribution device transport kit may be loaded on to an aircraft, a train, or a truck and delivered from the manufacturer to the customer. In various embodiments, method 700 further comprises removing the gas distribution device transport assembly once it arrives at the destination, and then installing the gas distribution device in (e.g., the customer's) reaction chamber for use in gas processes.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A gas distribution device transport assembly comprising:
   a gas distribution device transport comprising:
      a housing having a top surface comprising a recess therein, wherein the recess is configured to receive a gas distribution device;
      a clamping plate to secure the gas distribution device to the housing, wherein a lower portion of the gas distribution device is removably and sealably secured in the recess, and wherein a portion of the recess and a lower surface of the gas distribution device define a volume;
      a valve assembly coupled to the gas distribution device and in fluid communication with the volume; and
      a first data logger assembly comprising a first measurement device and a first memory device, wherein the first data logger assembly is coupled to one or more of the valve assembly or the housing.

2. The gas distribution device transport assembly of claim 1, wherein the gas distribution device comprises a showerhead.

3. The gas distribution device transport assembly of claim 1, further comprising a handle coupled to the clamping plate.

4. The gas distribution device transport assembly of claim 1, wherein the first data logger assembly records at least one of a pressure within the volume, a temperature of the gas distribution device, an acceleration of the gas distribution device, and a humidity within the gas distribution device.

5. The gas distribution device transport assembly of claim 1, wherein the first data logger assembly is cantilevered from the valve assembly.

6. The gas distribution device transport assembly of claim 4, further comprising a second data logger assembly comprising at least one second measurement device and a second memory device, wherein the second data logger assembly is coupled to one or more of the valve assembly or the housing.

7. The gas distribution device transport assembly of claim 6, wherein the second data logger assembly is coupled to the housing.

8. The gas distribution device transport assembly of claim 7, wherein the second data logger assembly records at least one of the pressure, the temperature, the acceleration, and the humidity.

9. The gas distribution device transport assembly of claim 1, wherein the first data logger assembly comprises a measurement display.

10. The gas distribution device transport assembly of claim 8, wherein at least one of the first data logger assembly and the second data logger assembly are configured to wirelessly communicate at least one of the pressure, the temperature, the acceleration, and the humidity.

11. The gas distribution device transport assembly of claim 10, further comprising one or more anchors coupled to the top surface.

12. A gas distribution device transport kit, comprising:
   a kit housing, wherein the kit housing comprises:
      a housing wall comprising a wall top surface;
      a main compartment configured to receive a gas distribution device transport assembly;
      the gas distribution device transport assembly comprising:
         a gas distribution device transport comprising:
            a housing having a top surface comprising a recess therein, wherein the recess is configured to receive a gas distribution device;
            a clamping plate to secure the gas distribution device to the housing, wherein a lower portion of the gas distribution device is removably and sealably secured in the recess, and wherein a portion of the recess and a lower surface of the gas distribution device define a volume;
            a valve assembly coupled to the gas distribution device and in fluid communication with the volume; and
            a data logger assembly comprising a first measurement device and a first memory device, wherein the data logger assembly is coupled to one or more of the valve assembly or the housing; and
      a top configured to engage the kit housing to enclose the gas distribution device transport assembly.

13. The gas distribution device transport kit of claim 12, further comprising a display on the top of the kit housing.

14. The gas distribution device transport kit of claim 12, wherein the kit housing further comprises a second compartment adjacent to the main compartment configured to hold an exhaust duct.

15. The gas distribution device transport kit of claim 14, further comprising a third compartment adjacent to the main compartment, wherein the third compartment is configured to hold a flow control ring.

16. A method of transporting a gas distribution device transport assembly, comprising:
   coupling a gas distribution device to a housing to form the gas distribution device transport assembly, wherein the gas distribution device transport assembly comprises the housing having a top surface comprising a recess therein, wherein the recess is configured to removably and sealably receive a bottom portion of the gas distribution device and wherein a portion of the recess and a lower surface of the gas distribution device define a volume;
   coupling a valve assembly to the gas distribution device, wherein the valve assembly and the volume are in fluid communication;
   reducing a pressure within the volume to a vacuum pressure;
   positioning the gas distribution device transport assembly within a main compartment of a gas distribution device transport kit;
   securing a top to the main compartment to enclose the gas distribution device transport assembly;
   logging data using a data logger assembly, wherein the data corresponds to one or more of: the pressure within the volume, a temperature of the gas distribution device, an acceleration of the gas distribution device, and humidity within the gas distribution device; and
   transporting the gas distribution device transport kit to a destination.

17. The method of transporting a gas distribution device transport assembly of claim 16, further comprising a step of performing a gas leak test of the gas distribution device transport assembly.

18. The method of transporting a gas distribution device transport assembly of claim 16, wherein the gas distribution device is a showerhead.

19. The method of transporting a gas distribution device transport assembly of claim 16, further comprising a step of comparing the data to a threshold value.

20. The method of transporting a gas distribution device transport assembly of claim 16, further comprising a step of removing the gas distribution device transport assembly and installing the gas distribution device in a reaction chamber.

* * * * *